(12) United States Patent
Early

(10) Patent No.: US 6,221,768 B1
(45) Date of Patent: Apr. 24, 2001

(54) USE OF IMPLANTED IONS TO REDUCE OXIDE-NITRIDE-OXIDE (ONO) ETCH RESIDUE AND POLYSTRINGERS

(75) Inventor: Kathleen R. Early, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/257,733

(22) Filed: Feb. 25, 1999

Related U.S. Application Data

(62) Division of application No. 09/009,909, filed on Jan. 21, 1998, now Pat. No. 5,939,750.

(51) Int. Cl.$^7$ .................................................. H01L 21/44
(52) U.S. Cl. .......................... 438/659; 438/423; 438/658
(58) Field of Search .................................. 438/257, 295, 438/423, 587, 658, 659

(56) References Cited

U.S. PATENT DOCUMENTS

| | | | |
|---|---|---|---|
| 3,897,274 | 7/1975 | Stehlin et al. | 438/407 |
| 4,104,090 | 8/1978 | Pogge | 438/409 |
| 4,105,805 | 8/1978 | Glendinning et al. | 438/703 |
| 4,749,660 | * 6/1988 | Short et al. | 438/766 |
| 4,814,285 | 3/1989 | Matlock et al. | 438/647 |
| 4,923,715 | 5/1990 | Matsuda et al. | 427/237 |
| 5,316,959 | 5/1994 | Kwan et al. | 438/270 |
| 5,342,801 | 8/1994 | Perry et al. | 438/719 |
| 5,346,842 | 9/1994 | Bergemont | 438/257 |
| 5,378,648 | 1/1995 | Lin et al. | 438/588 |
| 5,427,967 | 6/1995 | Sadjadi et al. | 438/258 |
| 5,436,175 | 7/1995 | Nakato et al. | 438/766 |
| 5,461,001 | 10/1995 | Kurtz et al. | 438/51 |
| 5,468,657 | 11/1995 | Hsu | 438/766 |
| 5,589,407 | 12/1996 | Mcyyappan et al. | 438/766 |
| 5,661,068 | 8/1997 | Hirao et al. | 438/398 |
| 5,668,034 | 9/1997 | Sery et al. | 438/266 |
| 5,679,745 | 10/1997 | Yamagata et al. | 428/698 |
| 5,682,052 | 10/1997 | Hidges et al. | 257/377 |
| 5,686,342 | 11/1997 | Lee | 438/409 |
| 5,773,328 | * 6/1998 | Blanchard | 438/162 |

OTHER PUBLICATIONS

Sze, S.M., Physics of Semiconductor Devices, (John Wiley & Sons, New York, 1981), pp. 496–497.*

High Density Plasma CVD and CMP for 25μm intermetal dielectric processing Pye, J.T., Fry, H.W. Schaffer W.J., Solid Sate Technology, pp. 65–71, Dec. 1995.

A Four-Metal Layer, High Performance Interconnect System for Bipolar and BiCMOS Circuits, Wilson Syd R., Freeman Jr. John L., Tracy Clarence J., Solid State Technology, pp. 67–71 Nov. 1991.

Interconnect Metallization for Future Generations, Roberts Bruce Harrus Alain Jacson Robert L., Solid State Technology pp. 69–78, Feb. 1995.

* cited by examiner

Primary Examiner—Richard Elms
Assistant Examiner—Christian D. Wilson
(74) Attorney, Agent, or Firm—Amin, Eschweiler & Turocy, LLP

(57) ABSTRACT

A method for fabricating a first memory cell and a second memory cell electrically isolated from each other. The method including forming a first polysilicon (poly I) layer on an oxide coated substrate and masking the poly I layer to pattern the first memory cell and the second memory cell and an unmasked portion therebetween. The unmasked portion of the poly I layer is transformed into an insulator such that the insulator electrically isolates the poly I layer (e.g., floating gate) of the first memory cell from the poly I layer (e.g., floating gate) of the second memory cell.

18 Claims, 10 Drawing Sheets

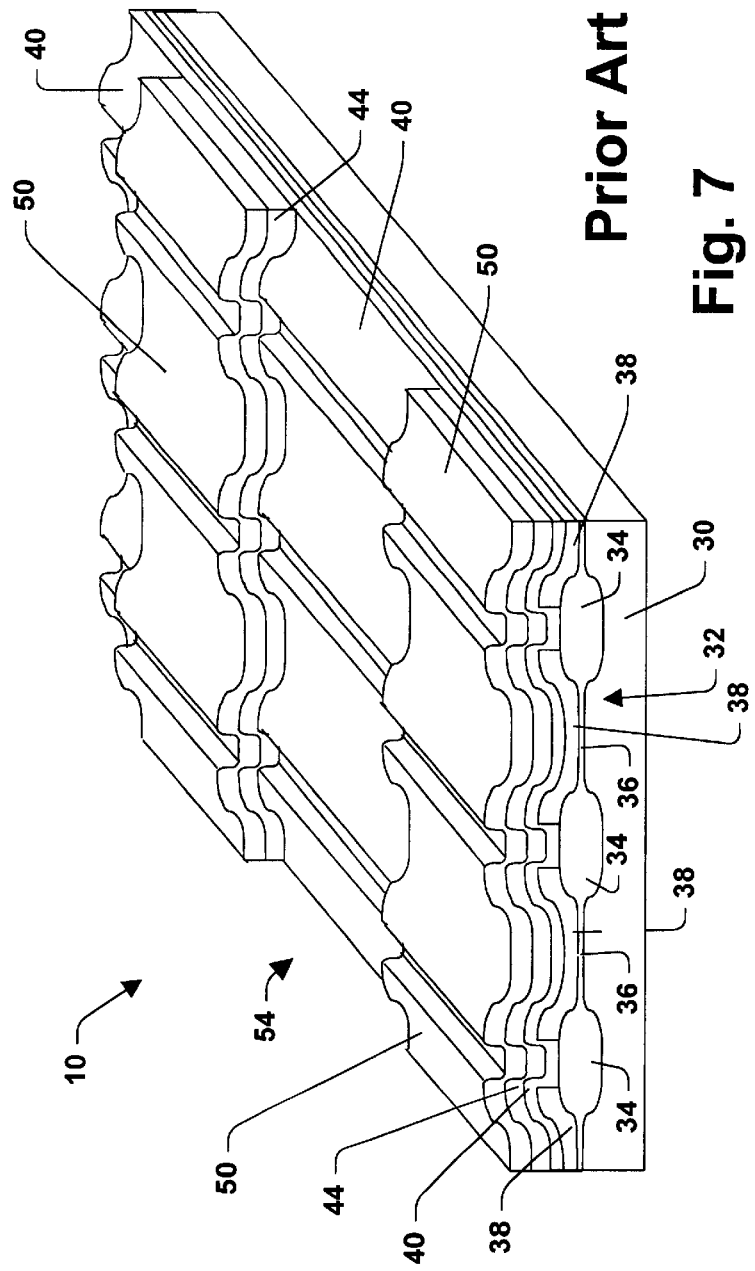
Fig. 7
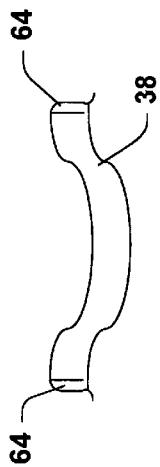
Fig. 10 Prior Art
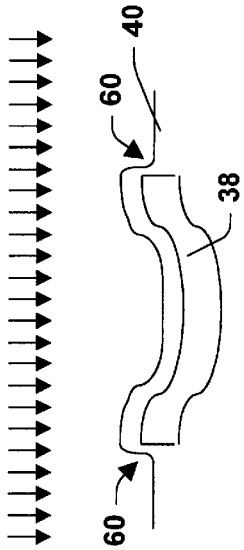
Fig. 9 Prior Art
Fig. 8 Prior Art

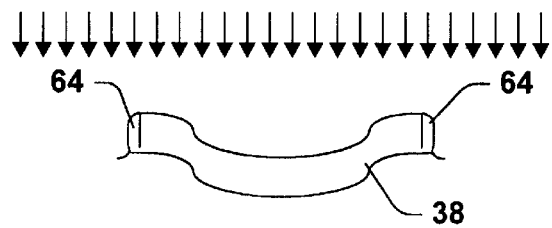
Fig. 11 Prior Art
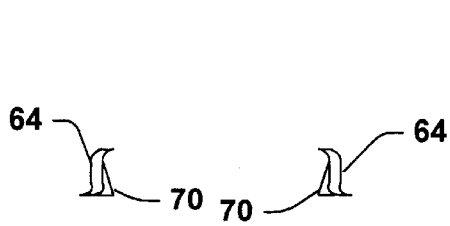
Fig. 12 Prior Art
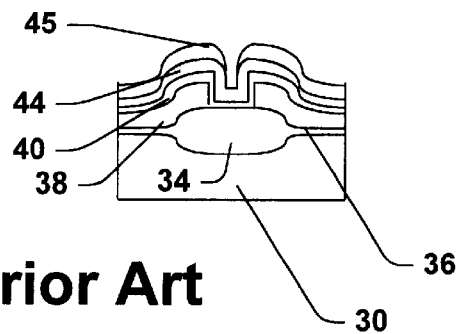
Prior Art Fig. 14
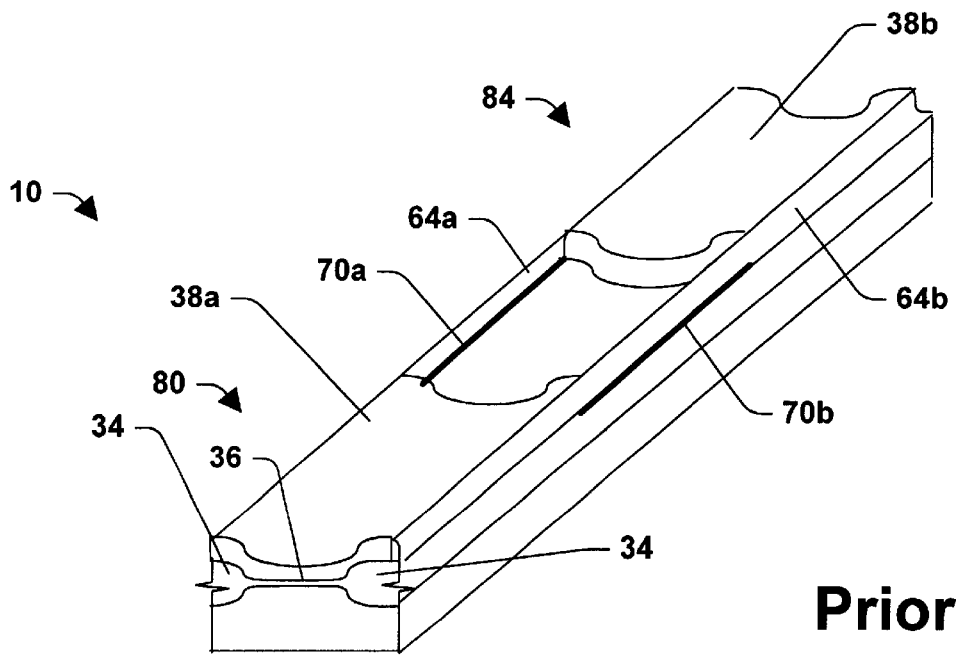
Prior Art Fig. 13

US 6,221,768 B1

USE OF IMPLANTED IONS TO REDUCE OXIDE-NITRIDE-OXIDE (ONO) ETCH RESIDUE AND POLYSTRINGERS

This is a divisional of application Ser. No. 09/009,909 filed Jan. 21, 1998, U.S. Pat. No. 5,939,750.

FIELD OF THE INVENTION

The present invention generally relates to integrated circuits and, in particular, to a method of memory device fabrication which improves memory cell reliability and manufacturability by preventing formation of poly stringers caused by an oxide-nitride-oxide (ONO) fence.

BACKGROUND OF THE INVENTION

Semiconductor devices typically include multiple individual components formed on or within a substrate. Such devices often comprise a high density section and a low density section. For example, as illustrated in prior art FIG. 1, a memory device such as a flash memory 10 comprises one or more high density core regions 12 and a low density peripheral portion 14 on a single substrate 16. The high density core regions 12 typically consist of at least one MxN array of individually addressable, substantially identical memory cells and the low density peripheral portion 14 typically includes input/output (I/O) circuitry and circuitry for selectively addressing the individual cells (such as decoders for connecting the source, gate and drain of selected cells to predetermined voltages or impedances to effect designated operations of the cell such as programming, reading or erasing).

The memory cells within the core portion 12 are coupled together in a circuit configuration, such as that illustrated in prior art FIG. 2. Each memory cell 20 has a drain 22, a source 24 and a stacked gate 26. Each stacked gate 26 is coupled to a word line ($WL_0$, $WL_1$, ..., $WL_N$) while each drain 22 is coupled to a bit line ($BL_0$, $BL_1$, ..., $BL_N$). Lastly, each source 24 is coupled to a common source line CS. Using peripheral decoder and control circuitry, each memory cell 20 can be addressed for programming, reading or erasing functions.

Prior art FIG. 3 represents a fragmentary cross-sectional diagram of a typical memory cell 20 in the core region 12 of prior art FIGS. 1 and 2. Such a memory cell 20 typically includes the source 24, the drain 22 and a channel 28 in a substrate 30; and the stacked gate structure 26 overlying the channel 28. The stacked gate 26 includes a thin gate dielectric layer 32 (commonly referred to as the tunnel oxide) formed on the surface of the substrate 30. The tunnel oxide layer 32 coats the top surface of the silicon substrate 30 and serves to support an array of different layers directly over the channel 28. The stacked gate 26 includes a lower most or first film layer 38, such as doped polycrystalline silicon (polysilicon or poly I) layer which serves as a floating gate 38 that overlies the tunnel oxide 32. On top of the poly I layer 38 is an interpoly dielectric layer 40. The interpoly dielectric layer 40 is often a multilayer insulator such as an oxide-nitride-oxide (ONO) layer having two oxide layers sandwiching a nitride layer, or an alternative can be any other dielectric layer such as tantalum pentoxide. Finally, the stacked gate 26 includes an upper or second polysilicon layer (poly II) 44 which serves as a polysilicon control gate overlying the ONO layer 40. The control gates 44 of the respective cells 20 that are formed in a given row share a common word line (WL) associated with the row of cells (see, e.g., prior art FIG. 2). In addition, as highlighted above, the drain regions 22 of the respective cells in a vertical column are connected together by a conductive bit line (BL). The channel 28 of the cell 20 conducts current between the source 24 and the drain 22 in accordance with an electric field developed in the channel 28 by the stacked gate structure 26.

According to conventional operation, the memory cell 20 (e.g., flash memory cell) operates in the following manner. The memory cell 20 is programmed by applying a relatively high voltage $V_G$ (e.g., approximately 12 volts) to the control gate 38 and a moderately high voltage $V_D$ (e.g., approximately 9 volts) to the drain 22 in order to produce "hot" (high energy) electrons in the channel 28 near the drain 22. The hot electrons accelerate across the tunnel oxide 32 and into the floating gate 34 and become trapped in the floating gate 38 because the floating gate 38 is surrounded by insulators (the interpoly dielectric 40 and the tunnel oxide 32). As a result of the trapped electrons, a threshold voltage ($V_T$) of the memory cell 20 increases by about 3 to 5 volts. This change in the threshold voltage (and thereby the channel conductance) of the memory cell 20 created by the trapped electrons is what causes the memory cell 20 to be programmed.

To read the memory cell 20, a predetermined voltage $V_G$ that is greater than the threshold voltage of an unprogrammed memory cell, but less than the threshold voltage of a programmed memory cell, is applied to the control gate 44. If the memory cell 20 conducts, then the memory cell 20 has not been programmed (the memory cell 20 is therefore at a first logic state, e.g., a zero "0"). Likewise, if the memory cell 20 does not conduct, then the memory cell 20 has been programmed (the memory cell 20 is therefore at a second logic state, e.g., a one "1"). Thus, each memory cell 20 may be read in order to determine whether it has been programmed (and therefore identify its logic state).

In order to erase the memory cell 20, a relatively high voltage $V_S$ (e.g., approximately 12 volts) is applied to the source 24 and the control gate 44 is held at a ground potential ($V_G=0$), while the drain 22 is allowed to float. Under these conditions, a strong electric field is developed across the tunnel oxide 32 between the floating gate 38 and the source region 24. The electrons that are trapped in the floating gate 38 flow toward and cluster at the portion of the floating gate 38 overlying the source region 24 and are extracted from the floating gate 38 and into the source region 22 by way of Fowler-Nordheim tunneling through the tunnel oxide 32. Consequently, as the electrons are removed from the floating gate 38, the memory cell 20 is erased.

Having described a structural arrangement of the memory cell 20, attention is now brought to fabrication of the memory device 10. FIG. 4 illustrates an overall arrangement of the memory device 10 at an early stage of formation. A substrate 30 is shown which comprises regions of thick oxide (field oxide) 34 and thin oxide (tunnel oxide) 32. The field oxide 34 provides for electrically insulating transistors from one and other. A poly I layer 38 has been laid down over the substrate 30, and sections of the poly I layer 38 have been patterned and masked such that an unmasked portion 42 is etched away using convention photolithographic techniques so as to form a series of poly I layer rows 38. FIG. 5 illustrates an ONO layer 40 laid down over the poly I layer rows 38 and the partially exposed field oxide regions 34 between the rows of poly I layer 38. More particularly, since sections of the poly I layer 38 have been etched away, gaps 42 exist between the rows of poly I layer 38 such that sidewalls of the poly I layer rows become coated with the ONO layer material 40 as it is being deposited. The etching step of the poly I layer 38 results in the ONO layer 40 being deposited thereon to be non-uniform in step height. More specifically, since there are gaps 42 between the rows of poly I layer 38, and since the ONO layer conforms to the topography on which it is deposited, the ONO that lies along the sidewalls of the etched poly I lines is significantly thicker that the ONO on top of either the flat portion of the poly I or the flat portion of the field oxide. It is to be appreciated that the thickness of the ONO layer 40 in the figures is shown to be relatively the same as the other layers for ease of understanding, however, the ONO layer 40 is actually very thin relative to the poly I layer 38 and poly II layer 44 (FIG. 6a).

After application of the ONO layer 40, the poly II layer 44 is laid down over the ONO layer 40 as shown in FIG. 6a. Like the ONO layer 40, the poly II layer 44 also includes undulations as a result of the gaps 42 between rows of the poly I layer 38. The gaps 42 result in the poly II layer 44 being undulated such that portions of the poly II layer 44 adjacent an edge of a respective poly I layer row 38 (where the ONO layer 40 is thickest) is greater in height with respect to the substrate surface 30 than a portion of the poly II layer 44 which lies relatively over other areas. As will be discussed in greater detail below, the gaps 42 may lead to discontinuing in ONO 40 and poly II 44 thickness and even possibly film cracks or breaks.

FIG. 6 illustrates a substantially large maximum step height ($Y_M$) that results because of the undulating poly II layer 44. In particular, the step height of a portion of the poly II layer that lies respectively over a poly I layer row 38 has a step height of $y_1$, and a portion of the poly II layer that lies respectively over the gap 42 between adjacent poly I layer rows has a step height of $y_2$. However, the portion of the poly II layer 44 which represents an undulation (i.e., the transition from the poly II layer lying over the poly I layer row 38 and over the gap 42 between poly I layer rows 38) has a step height of $y_M$, where $y_M$ is substantially greater in height than $y_1$ or $y_2$ and results in problems relating to overetch requirements and the formation of an ONO fence as will be discussed in greater detail below.

Referring now to FIG. 7, a resist 50 is lithographically patterned over portions of the poly II layer 44. Then, the poly II layer 44 is etched away at portions not covered by the resist 50, the etched away portion of poly II layer is generally designated at 54.

FIG. 8 is a partial cross-sectional view of the memory device 10 taken at the portion 54. As is seen, the poly II layer 44 has been etched away leaving an ONO layer 40 laid down next to and atop the poly I layer 38. The field oxide 34 and tunnel oxide 36 of the substrate 30 are not shown for ease of understanding. In FIG. 9, the ONO layer 40 is shown being substantially etched away using conventional etching techniques. The ONO layer 40 has a substantially greater step height at side wall portions 60 of the poly I layer 38. As a result, these side wall portions of ONO do not become completely etched away and leave what is coined an ONO fence 64 (FIG. 10) along the sidewalls of the poly I layer 38.

In FIG. 11, the poly I layer 38 is substantially etched away using conventional etching techniques. However, a problem often occurs at this step involving formation of poly stringers. Poly stringers result from incomplete removal of poly I from the unmasked portions of the wafer during etch. The poly stringers that we are concerned with here are created during the self-aligned etch (SAE). During the SAE, the ONO and then the poly I between adjacent second gate lines is etched away. In the SAE, the second gate lines act as a mask. This results in substantially perfect alignment of the first gate with the second gate along a direction perpendicular to the second gate lines—hence, the name self-aligned etch. During the SAE, the ONO 64 along the sidewalls of the poly I is only partially removed, resulting in the ONO fence. When the poly I 38 is etched, for some memory cells a small "string" of polysilicon is hidden from the etch by the ONO fence. If this happens to even a few cells in the memory the memory chip will not function properly. As shown in FIG. 12, the ONO fence 64 acts as an umbrella and shields portions of the poly I layer 38 from being etched away. These remaining portions of poly I material are known as poly I stringers 70, which may result in electrically shorting adjacent memory cells 20. In other words, the poly I etching step of FIG. 11 serves in part to isolate one memory cell 20 from another. However, if a portion of the poly I layer 38 is not etched away and forms a conductive path (e.g., poly stringer 70) from one memory cell 20 to another, the memory cells 20 may become electrically shorted.

FIG. 13 illustrates in perspective view the ONO fences 64a, 64b that have lead to the formation of poly stringers 70a, 70b which may cause shorting of poly I layers 38a and 38b of two memory cells 20a and 20b, respectively. The polysilicon floating gates 38a and 38b rest on the oxide coated substrate 30. The ONO fences 64a and 64b remain along the sidewalls of the poly I layers 38a and 38b and in the region 80 between the two memory cells 20a and 20b. The additional layers that make up the stacked gate structure 26 of the respective memory cells 20a and 20b are not shown in prior art FIG. 13 for sake of simplicity.

As long as the initial etching of the polysilicon floating gate 38 (which delineates cells 20 along a single word line) occurs in an ideally anisotropic manner, no poly stringers are formed during the second etching of the floating gate 38 (which delineates separate word lines). It is well known, however, that anisotropic etch processes do not repeatably provide ideally anisotropic profiles. Instead, most anisotropic etch processes provide non-ideal profiles in the range of about 85–95° (wherein 90° is ideal). A non-ideal anisotropic etch profile as is illustrated in prior art FIG. 12 leaves an angled ONO fence 64 which acts as an umbrella (or shield) to the poly I etch.

More specifically, when the polysilicon gate 38 is subsequently etched (in an anisotropic manner via, e.g., reactive ion etching (RIE)), as illustrated in prior art FIG. 11, the angled ONO fence 64 shields a portion of the polysilicon gate 38, resulting in remnants of polysilicon, which are the poly stringers 70. Transposing the non-ideally anisotropic etched polysilicon gate 38 and the resulting poly stringers 70 into their macroscopic context (as illustrated in prior art FIG. 13), it is clear that the poly stringers 70 pose a substantial reliability problem since the poly stringers 70 in the etched region 80 can short out the word lines in regions 82 and 84, respectively. That is, instead of the etched region 80 electrically isolating the word lines in regions 82 and 84 from one another, the poly stringers 70 (which are conductive) span the etched region 80 and cause the poly I layers (i.e., floating gates) 38a and 38b in the regions 82 and 84 to be shorted together.

Consequently, in light of the above, it would be desirable to have a method for fabricating a memory cell such that the formation of an ONO fence and resulting poly stringers is eliminated or otherwise substantially reduced.

SUMMARY OF THE INVENTION

The present invention provides for a method of manufacturing a memory cell which prevents the formation of poly stringers resulting from an ONO fence. ONO fences typically result from an anisotropic etching step which leaves an ONO fence on sidewalls of a poly I layer. As noted above, the ONO fence can result in the formation of poly stringers which may short adjacent memory cells. The present invention removes the need for an initial poly I etching step which in turn avoids formation of an ONO fence and which in turn prevents polystringers from forming.

According to the present invention, a poly I layer is masked to pattern future memory cells. In other words, a poly I mask is configured to isolate floating gate regions of memory cells in a desired manner. The unmasked portions of the poly I layer are transformed into insulating portions (e.g., silicon oxide, silicon dioxide, silicon nitride, silicon oxynitride, etc.) by a suitable technique in accordance with the present invention. The resulting insulating portions serve to isolate the floating gates of patterned memory cells from one another.

The present invention eliminates the need to perform an initial etch of the poly I layer as is done conventionally, which in turn eliminates formation of an ONO fence and subsequent formation of poly stringers. More specifically, since the poly I layer is not etched, ONO is never formed adjacent a row or column of poly I because the area between rows or columns of poly I is occupied by an insulating medium (e.g., poly I transformed into silicon dioxide). In the present invention, the ONO is deposited on a wafer surface that is free of changes in height that occur over angles greater that ~60°. That is, changes in the height of the surface of the wafer result from gentle undulations rather than from substantially abrupt 90° steps. In particular, since there is no initial poly I etch step there is no formation of gaps between poly I rows as which result using conventional memory cell fabrication techniques. Rather, the areas that conventionally exist as gaps between rows of poly I are occupied by the insulating medium (e.g., silicon dioxide) in accordance with the present invention. Therefore, an ONO fence is prevented from forming which thus avoids the subsequent formation of poly I stringers which may lead to shorting floating gates among conventionally fabricated memory cells.

Furthermore, because there are no open gaps between rows of poly I layer, the ONO layer and poly II layer deposited over the poly I layer do not have substantially abrupt 90° steps, which results in nearly uniform step height of the ONO film as seen by the highly anisotropic poly I etch. As a result of forming a poly II layer without abrupt undulations, a maximum step height of the poly II layer is reduced. The reduction in maximum step height of the poly II layer affords for reducing overall over etch requirements for the poly II material. In other words, since the maximum step height of the poly II layer is reduced, as compared to conventionally fabricated memory devices, less etching of the poly II layer is required.

In addition, the mitigation of abrupt step heights of the various layers by the present invention also results in a second gate stack (e.g., comprising the ONO layer, poly II layer and topside layer) of low resistance (i.e., less cracks) as compared to second gate stacks fabricated in accordance with conventional techniques. This is because abrupt changes in step heights of the various layers result in weak portions of the respective layers at the points where the abrupt changes in step height occur. In other words, in conventionally fabricated memory devices, breaks, cracks or holes may result in a topside layer 45 and possibly underlying layers at portions lying over the gaps between poly I lines as shown in prior art FIG. 14. Therefore, by reducing or eliminating the abrupt step heights the respective layers are less susceptible to cracks and as a result exhibit low resistance.

Thus, the present invention improves memory cell reliability and manufacturability by preventing formation of poly I stringers caused by an ONO (oxide-nitride-oxide) fence, provides for reduction of over etch requirements of gate structure layer materials (e.g., poly II layer) and affords for a second gate stack having low resistance.

In accordance with one specific aspect of the present invention, a method for fabricating a group of memory cells is provided. The method includes the steps of: forming a first polysilicon (poly I) layer; and transforming at least a portion of the poly I layer into an electrically nonconductive material, the electrically nonconductive portion isolating at least two portions of the poly I layer from each other to create floating gates.

Another specific aspect of the present invention provides for a group of memory cells. The group of memory cells includes: a first memory cell and a second memory cell, the first and second memory cells each including a poly silicon (poly I) layer, the poly I layers serving as floating gates. The group of memory cells further includes an electrically nonconductive medium isolating the floating gate of the first memory cell from the floating gate of the second memory cell, the electrically semiconductor medium being poly I material converted into nonconductive material.

According to still another specific aspect of the present invention, a method for fabricating a first memory cell and a second memory cell electrically isolated from each other is provided. The method includes the steps of forming a first polysilicon (poly I) layer on an oxide coated substrate and masking the poly I layer to pattern the first memory cell and the second memory cell and an unmasked portion therebetween. The method also includes the step of transforming the unmasked portion of the poly I layer into an insulator via ion implantation and annealing such that the insulator electrically isolates a floating gate of the first memory cell from a floating gate of the second memory cell.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 7 is a perspective illustration of the prior art memory device of FIG. 6a after a resist layer has been laid down and portions of the poly II layer have been etched away;

FIG. 8 is a cross-sectional view of the poly I layer, having the ONO layer thereon, of the prior art memory device of FIG. 7;

FIG. 9 is a cross-sectional view of the prior art memory device of FIG. 8, wherein the ONO layer is being etched away;

FIG. 10 is a cross-sectional view of the prior art memory device of FIG. 9, depicting an ONO fence remaining along sidewalls of the poly I layer after the ONO etch step;

FIG. 11 is a cross-sectional view of the prior art memory device of FIG. 10 wherein the poly I layer is being etched away;

FIG. 12 is a cross-sectional view of the prior art memory device of FIG. 11 wherein the ONO fence shields poly I portions from being etched away during the poly I etch of FIG. 11;

FIG. 13 is a perspective illustration of the prior art memory device of FIG. 12 depicting ONO fences and poly stringers electrically shorting floating gates of adjacent memory cells;

FIG. 14 is a cross-sectional view of a prior art memory device where breaks have occurred in a topside layer;

DETAILED DESCRIPTION OF THE INVENTION

Figure 1:
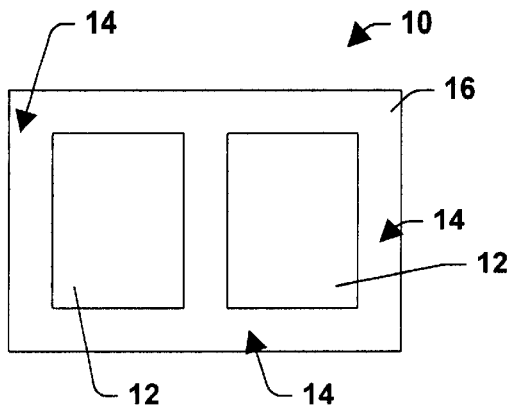
FIG. 1 is a plan view schematically illustrating a prior art layout of a memory device.
Figure 2:
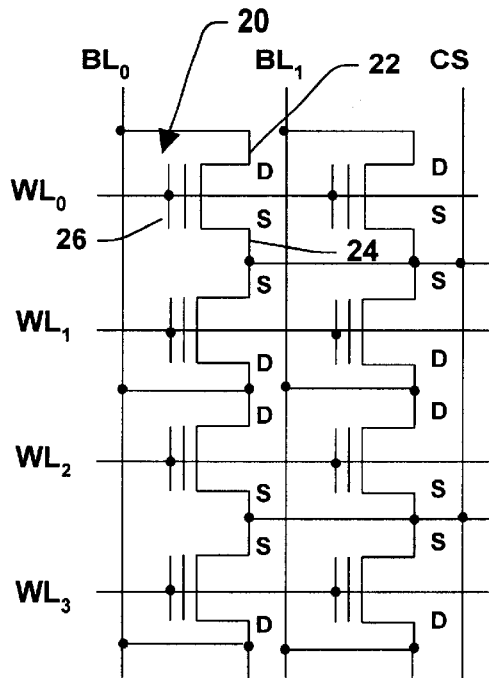
FIG. 2 is a schematic diagram illustrating a prior art core portion of a memory circuit.
Figure 3:
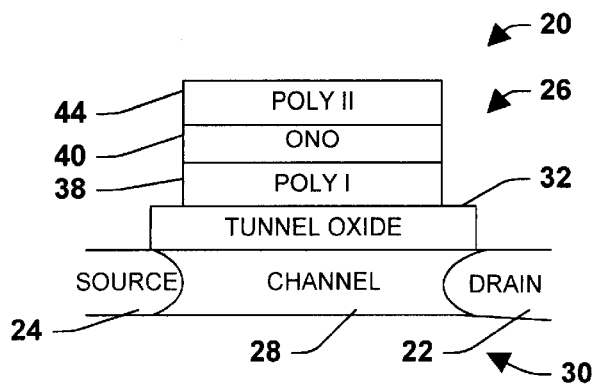
FIG. 3 is a partial cross-sectional view of a prior art stacked gate memory cell.
Figure 4:
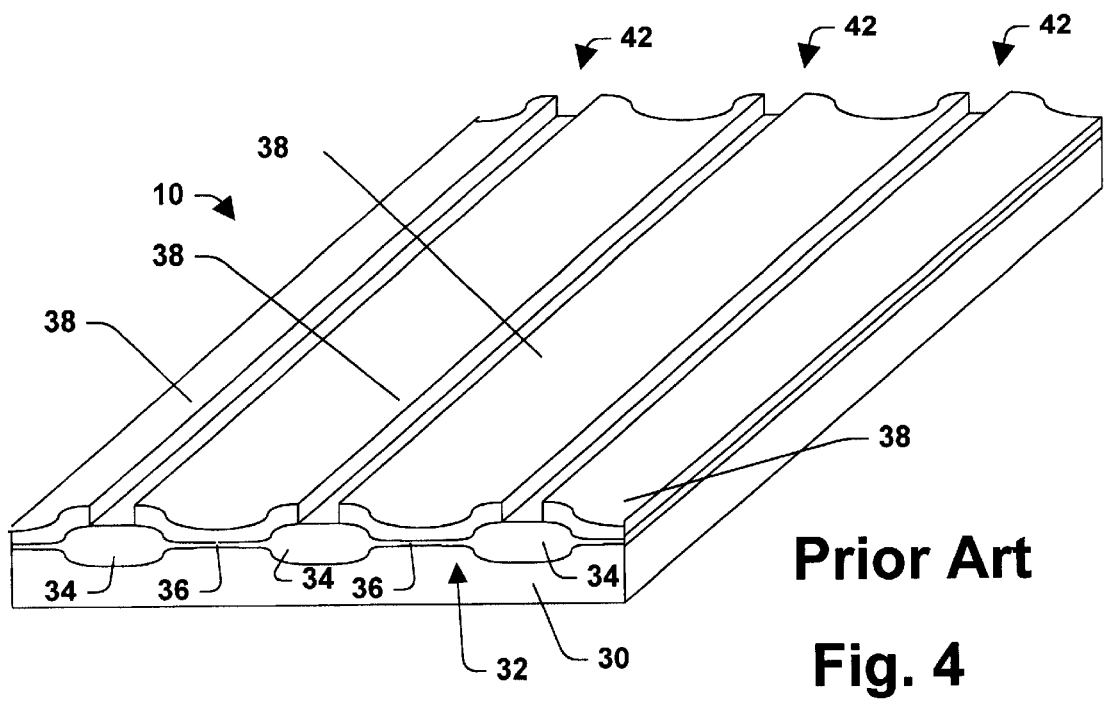
FIG. 4 is a perspective illustration of a portion of a prior art memory device at an early stage in fabrication.

The present invention will now be described with reference to the drawings, wherein like reference numerals are used to refer to like elements throughout.

In the present invention an initial poly I layer etch step is not performed which avoids formation of an ONO fence that may be formed under convention memory cell fabrication techniques. The elimination of the ONO fence prevents the formation of poly stringers which as mentioned above may short out adjacent memory cells. Additionally, the present invention provides a substrate for deposition of the poly II layer that is substantially free of abrupt 90° steps. This results in reduced maximum film thickness or step height for the poly II layer as compared with that of memory cells fabricated in accordance with conventional processes. The reduction in maximum step height of the poly II layer affords for reduced over etching requirements of the poly II layer.

Figure 15:
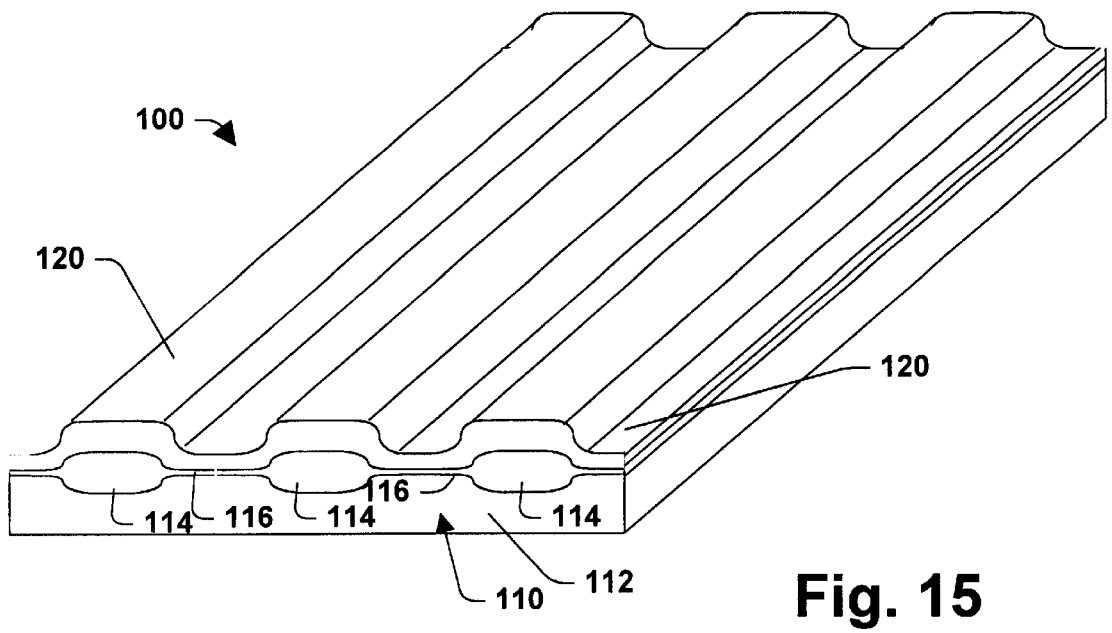
FIG. 15 is a perspective illustration of a portion of a memory device at an early stage in fabrication in accordance with the present invention.

Turning now to FIG. 15, an overall arrangement of a memory device 100 at an early stage of formation is shown in accordance with the present invention. In particular, a silicon substrate 112 is shown comprising field oxide regions 114 and tunnel oxide regions 116. It should be appreciated that although specific layering materials are identified in the preferred embodiment, any materials suitable for carrying out the present invention may be employed and fall within the scope of the claims. A doped polycrystalline silicon (polysilicon or poly I) layer 120 is laid down over the prepared substrate 112. In the present invention, the poly I layer 120 is not etched as is done conventionally. Rather, as will be discussed in greater detail below, portions of the poly I layer 120 are transformed into insulating portions such as for example silicon dioxide. The insulating portions serve as nonconductive isolators of floating gates (i.e., poly I layers) of memory cells of the memory device 100.

Figure 16:
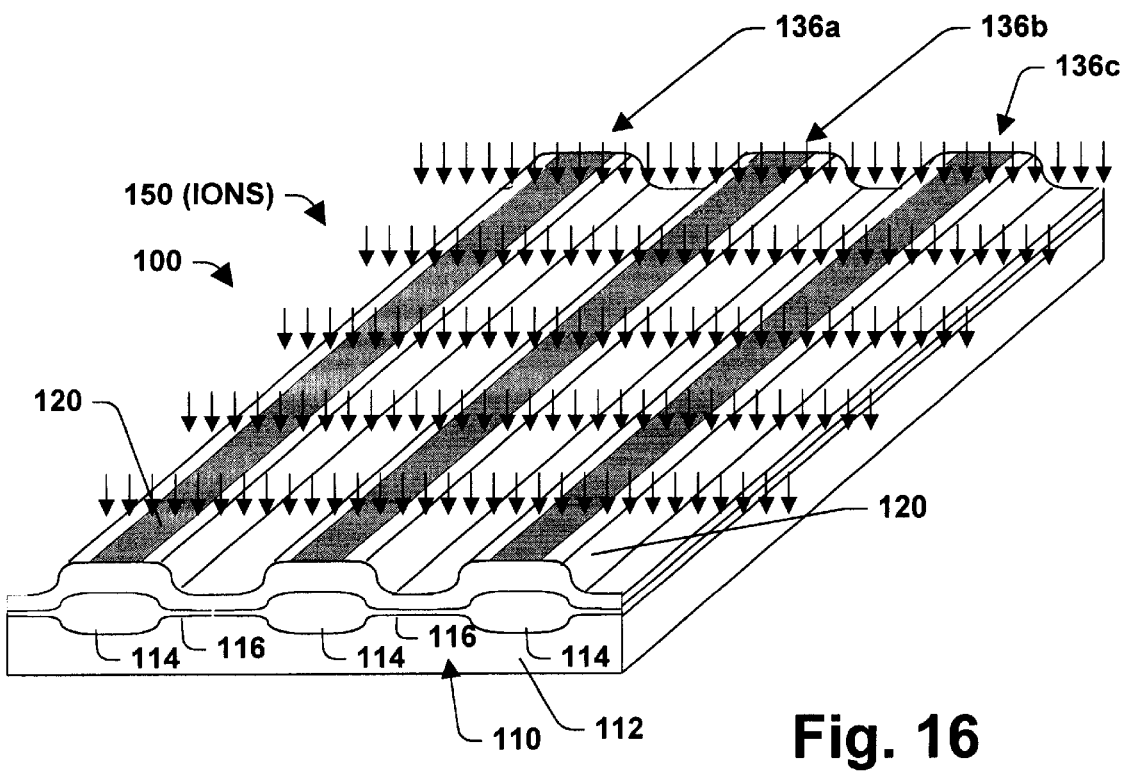
FIG. 16 is a perspective illustration of the memory device of FIG. 15 wherein a portion of a poly I layer is being transformed into an insulator (e.g., silicon dioxide) in accordance with the present invention.

Turning now to FIG. 16, a step of transforming portions of the poly I layer 120 into silicon dioxide ($SiO_2$) is shown. It will be appreciated that although the present invention is described with respect to forming silicon dioxide insulating portions, any suitable material may be employed as the insulating portions. For example, but not to be considering limiting, the insulating portions may comprise any of the following compounds: silicon oxide, silicon nitride, and silicon oxy-nitride. A mask (e.g., silicon nitride) is patterned over portions of the poly I layer 120 which are not to be transformed into silicon dioxide. The unmasked portions 136a, 136b and 136c of the poly I layer 120 are to be converted into insulating silicon dioxide. An exemplary procedure for forming the silicon dioxide portions 136a, 136b and 136c will be explained below, however, any suitable technique for forming silicon dioxide may be employed to carry out the present invention and is intended to fall within the scope of the claims.

Selected portions (i.e., unmasked areas) of the polysilicon layer 120 are converted into insulator material by implanting ions, such as oxygen or nitrogen. If silicon oxide or silicon dioxide is desired, the implantation is performed with oxygen. If silicon nitride is desired as the insulator material, the implantation is performed with nitrogen, and if silicon oxy-nitride is desired the implantation is performed with both oxygen and nitrogen. A suitable mask (e.g., silicon nitride) is chosen having a suitable thickness such that the ions being implanted do not penetrate through the mask and thus will not convert the underlying poly I portions into insulating material. However, the unmasked portions of the poly I layer 120 will be exposed to the ions and thus will be transformed into insulating material (e.g., silicon dioxide).

An ion beam 150 is directed to impinge upon the surface of the partially masked poly I layer 120. A predetermined ion acceleration voltage is selected to effect implantation at the desired distance throughout the unmasked poly 1 layer 120. As is known in the art, the distance that an ion will travel through a material is proportional to the accelerating energy. In accordance with the present invention, ions are selected that are effective to form an insulating compound with the semiconductor material. For example, when polysilicon is utilized as the poly I layer material, ions of oxygen, nitrogen or carbon are preferably utilized. Thus, upon implantation of ions in the polysilicon material and subsequent and/or concurrent annealing, oxygen ions for example convert unmasked portions of the polysilicon 120 into silicon dioxide. Similarly, carbon ions form silicon carbide and nitrogen ions form silicon nitride. These compounds (i.e., silicon dioxide, silicon carbide and silicon nitride) are all electrically insulating.

A sufficient dose of ions is implanted to effect conversion of a significant number of the polysilicon atoms into the insulating material. In the preferred embodiment, substantially all of the unmasked portions of polysilicon are converted into insulating material. For example, according to one specific example, oxygen ions may be implanted at an energy within about the range of 1 to 10 KeV with a dose within about the range of $1 \times 10^{17}$ ions/cm$^2$ to $1 \times 10^{18}$ ions/cm$^2$. Accordingly, the ion implantation is carried out using a 1 to 10 KeV ion implanter (not shown). However, the particular ion implanter used is not critical for carrying out the present invention. It will be appreciated that a suitable energy level and dose of the implants will vary according to mask parameters and poly I layer parameters, and the scope of the present invention is intended to encompass all such energy and dosage ranges of the implants suitable for carrying out the subject invention. In other words, the implant energy and angle may be tailored to create a desired profile between the poly I and the oxidized poly I.

After the doping/implantation of the unmasked portions of the poly I layer with the implant ions (e.g., oxygen, nitrogen or carbon), the structure 100 undergoes an annealing process where the structure is exposed to a low temperature reaction bake or heat treatment. For example, the implanted poly I layer 136 is then annealed in a flowing atmosphere of oxygen at about 900° C. for about 30 minutes. Depending on the thermal budget for a particular device, the anneal may be either a furnace anneal, a rapid thermal anneal (RTA) or any other suitable anneal. For example, the anneal may be a rapid thermal oxidation (RTO)), where oxygen in the anneal environment is being used to densify the oxide.

Generally speaking, an argon or nitrogen RTA is appropriate for static random access memories (SRAMs) and other memory devices having a more restrictive thermal budget, while a furnace anneal is suitable for most other types of devices. As a result of the anneal, portions of the poly I layer 136 implanted with the ions and thus rendered amorphous are transformed into insulating material (e.g., portions implanted with oxygen become silicon dioxide ($SiO_{x(x \leq 1)}$) where oxygen is doped, and become $Si_3N_{y(y \leq 4)}$ where nitrogen is doped, etc.). If nitrogen is used as the implant, the annealing is carried out in a nitrogen atmosphere, etc.

It is to be appreciated that aforementioned implantation and anneal steps can be tailored so that the entrant angles of the subsequently formed oxide portions 160 are such that the oxide portions 160 are wider at the bottom than the top. If the oxide portions 160 are formed so that they do not exhibit a re-entrant profile the adjacent poly I rows will be wider at the top than the bottom and thus may facilitate mitigating formation of poly I stringers.

Figure 17:
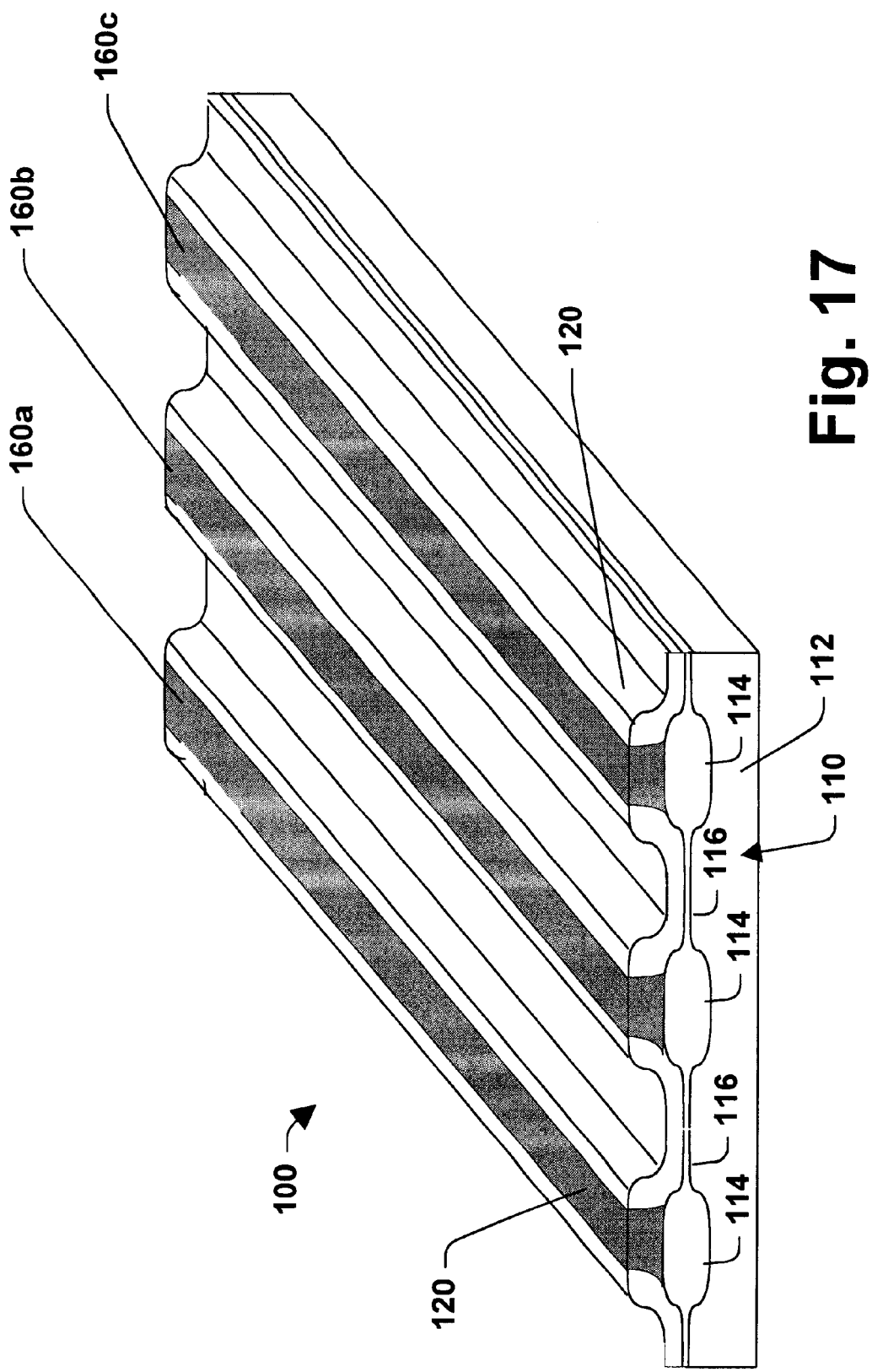
FIG. 17 is a perspective illustration of the memory device of FIG. 16 after the portion of the poly I layer has been transformed into an insulator (e.g., silicon dioxide) in accordance with the present invention.

Referring now to FIG. 17, the unmasked portions 136 are shown transformed into silicon dioxide ($SiO_2$) via the aforementioned implantation/annealing step. As a result of the oxygen implantation and subsequent annealing, the unmasked portions 136 are transformed into silicon dioxide portions 160. The silicon dioxide portion(s) 160 shall serve to insulate a floating gate of one memory cell from that of another memory cell.

Figure 5:
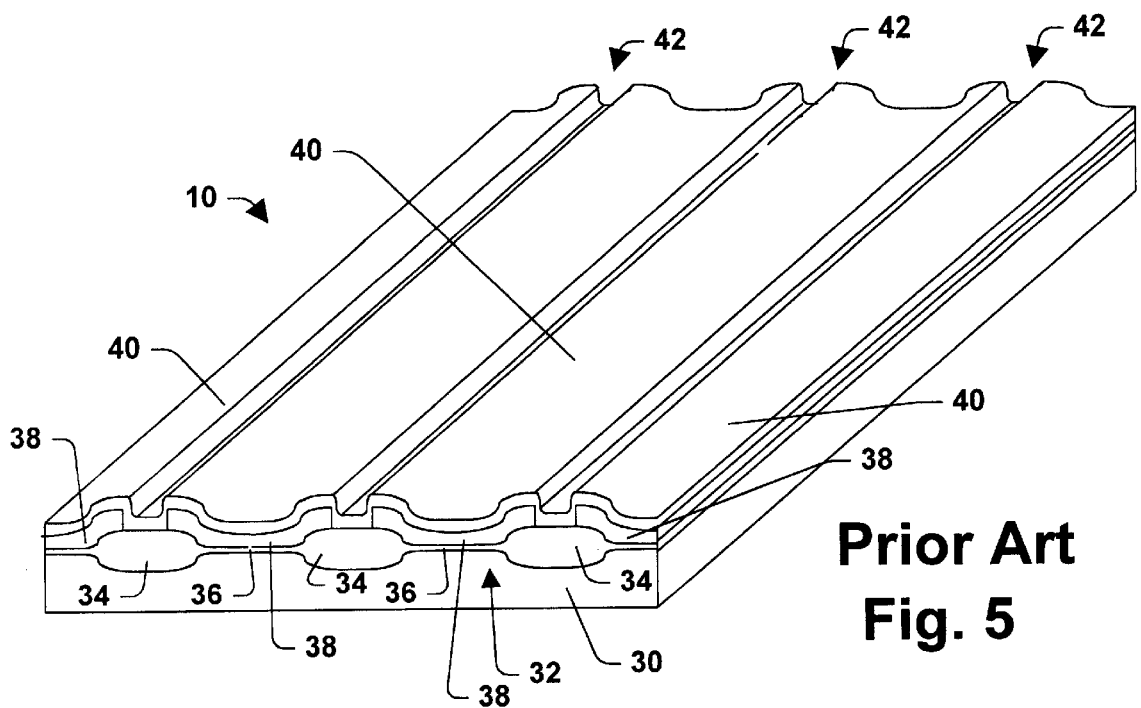
FIG. 5 is a perspective illustration of the prior art memory device of FIG. 4 after formation of an ONO layer.
Figure 6A:
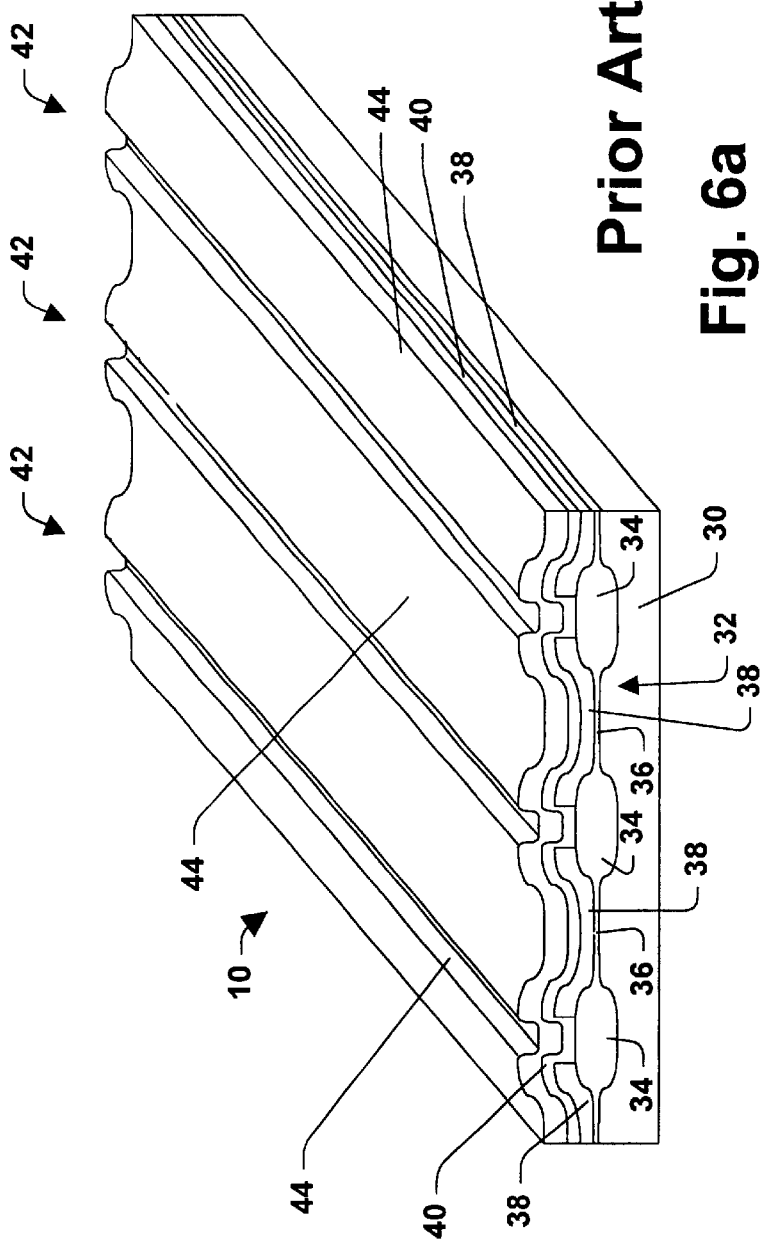
FIG. 6a is a perspective illustration of the prior art memory device of FIG. 5 after formation of a poly II layer.
Figure 6B:
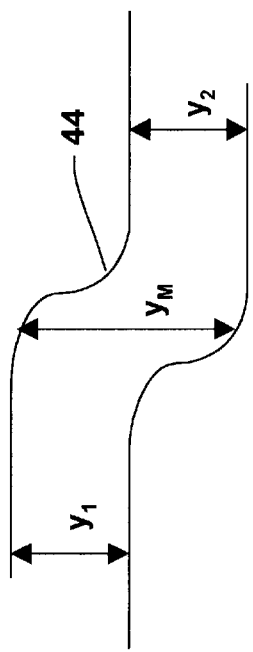
FIG. 6b is a cross-sectional view showing the variation in thickness of the poly II layer in the vicinity of the step in poly I.
Figure 18:
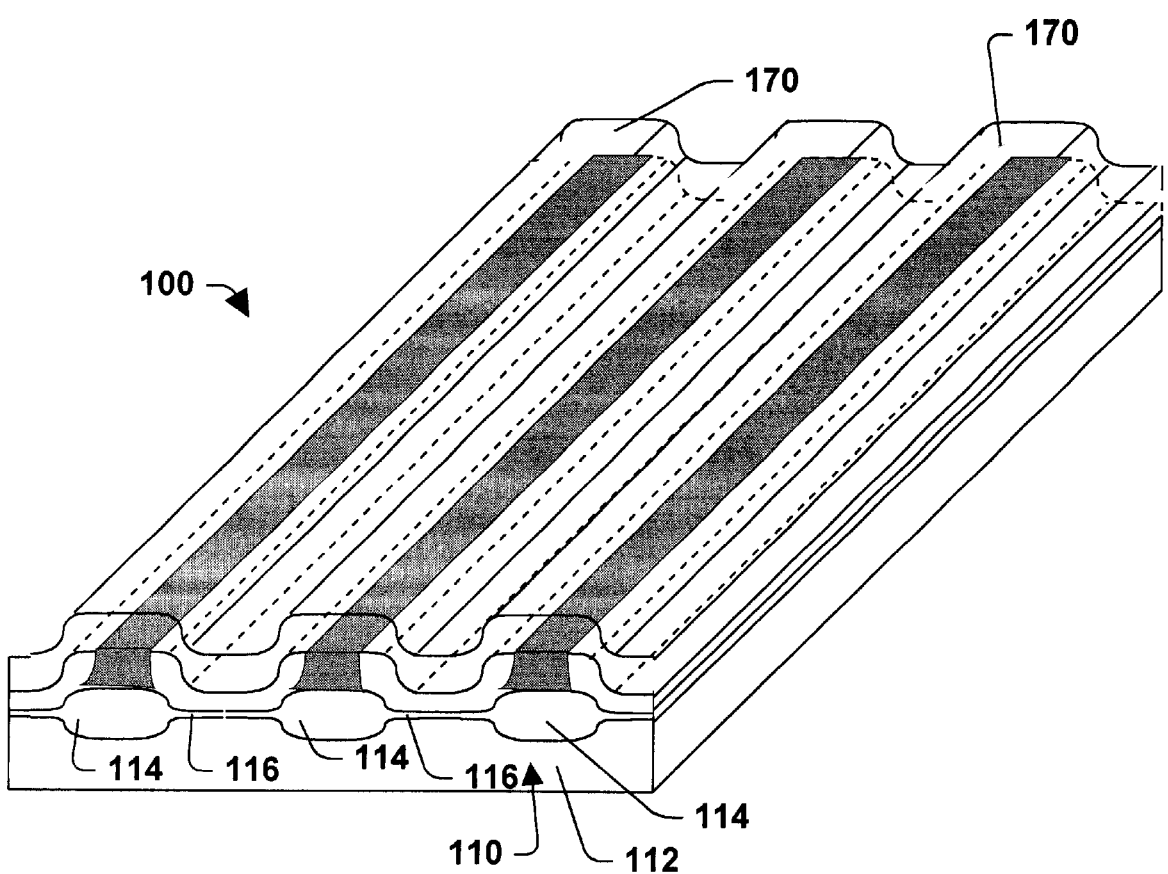
FIG. 18 is a perspective drawing illustrating the memory device of FIG. 17 after an ONO layer has been deposited over the poly I portions and the insulator portion in accordance with the present invention.

Referring now to FIG. 18, after the silicon dioxide portions 160 are formed an ONO layer 176 is deposited over the poly I layers 120 and the silicon dioxide portions 160. Because the poly I layer 120 is not etched but rather a portion which would have been etched conventionally is now converted into silicon dioxide in the manner described above, the ONO layer 176 is fully exposed to plasma etch (e.g., substantially free of abrupt undulations). In other words since no vertical surfaces are created in the poly I layer 120, the ONO layer 176 is free of abrupt vertical transitions that could create substantial disparity in ONO thickness as in conventionally fabricated memory devices (see e.g., FIG. 5). The silicon dioxide portions 160 are shown shaded and in phantom in FIG. 18 to illustrate that they lie adjacent poly I layers 120, which all lie under the ONO layer 176.

Because the poly I layer 120 is not initially etched, an ONO fence is prevented from forming along sidewalls of the poly I layer 120. More particularly, ONO is not laid down along the sidewalls of the poly I lines 120 because the transitions from the poly I lines 120 to the silicon dioxide portions 160 are gradual rather than abrupt. As a result, the ONO layer 176 is only laid down over the top surfaces of the poly I lines 120 and the silicon dioxide portions 160, respectively. The elimination of ONO fence formation results in the avoidance of poly I stringers being formed as a result of an ONO fence shielding portions of the poly I material during an initial etching step as described above. (see e.g., prior art FIG. 14).

Figure 19:
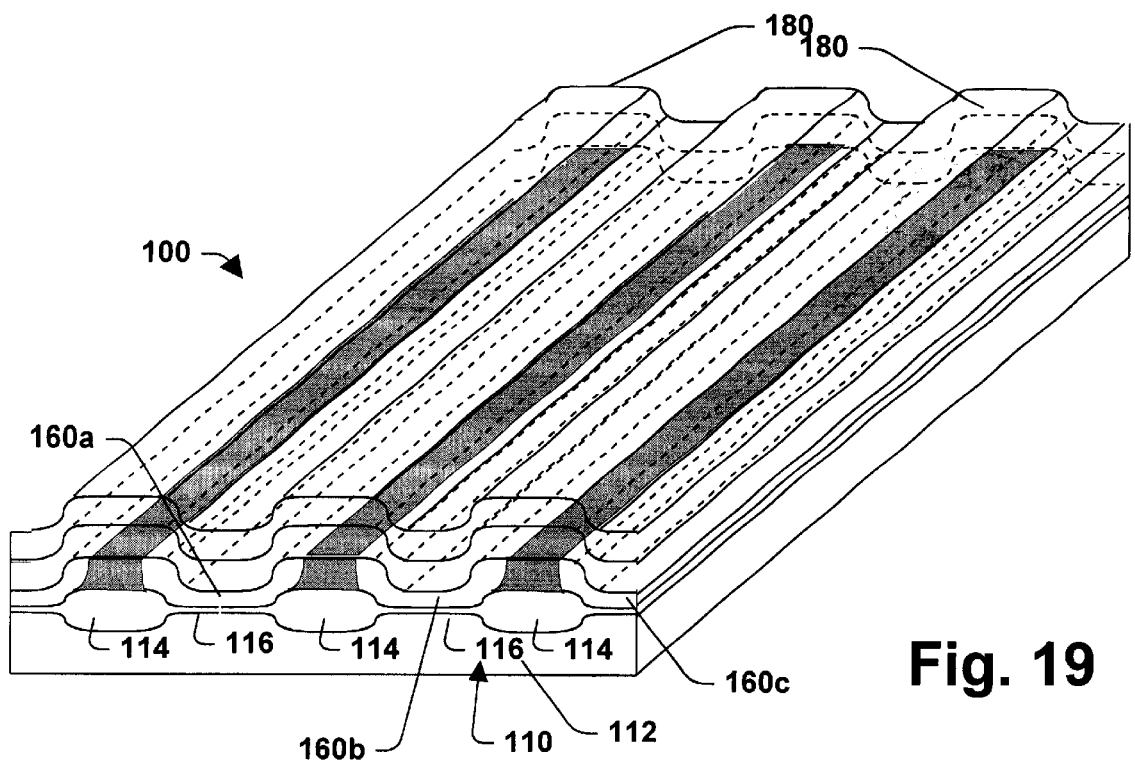
FIG. 19 is a perspective drawing illustrating the memory device of FIG. 18 after a poly II has been deposited over the ONO layer in accordance with the present invention.
Figure 20:
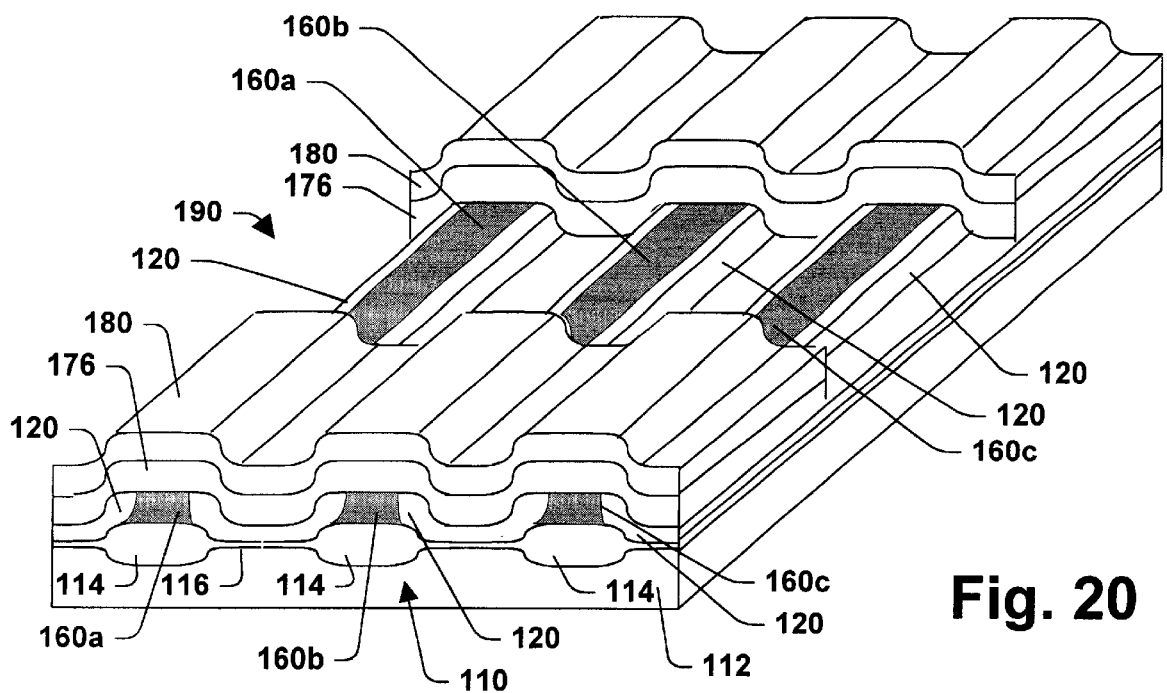
FIG. 20 is a perspective drawing illustrating the memory device of FIG. 19 after an unmasked portion of the poly II layer has been etched away to the poly I and insulator layers in accordance with the present invention.
Figure 21:
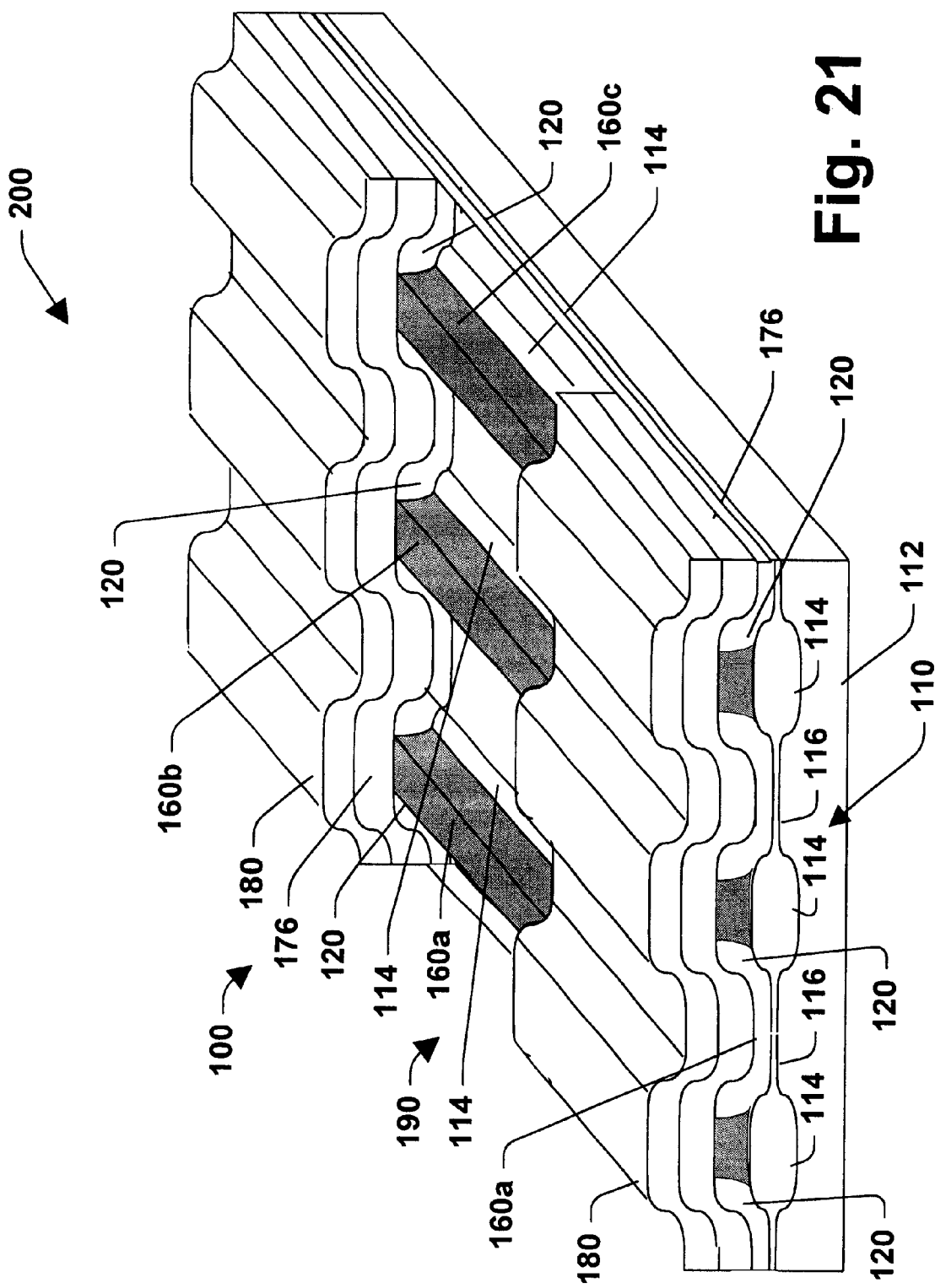
FIG. 21 is a perspective drawing illustrating electrically isolated memory cells after a substantially final etching step in accordance with the present invention.

Turning now to FIGS. 19–21 in consecutive order, a poly II layer 180 is shown being laid down over the ONO layer 176. Because the ONO layer 176 is substantially free of abrupt undulations, the poly II layer 180 deposited thereon is also substantially free of abrupt undulations. Thereafter, the poly II layer 180 is masked such that unmasked portions 190 of the poly II layer 180 are etched away using suitable techniques. Then, a second masking/etching step is performed to isolate individual memory cells 200. In this masking/etching step the unmasked portions of the ONO layer 176 and the poly I layer 120 are etched away to leave isolated memory cells 200. It should be appreciated that if desired the oxidized poly I portions 160 or other inter-poly-I dielectric may be etched away as well.

The present invention thus removes the need for an initial poly I etching step which in turn avoids formation of an ONO fence resulting in prevention of poly stringer formation. Additionally, by not requiring an initial poly I etch step, layers formed over the poly I layer are substantially free of abrupt undulations and thus have reduced maximum step height as compared to layers of memory cells fabricated using conventional techniques. By reducing the maximum step height, the present invention provides for a reduction in overetch requirements.

Those skilled in the art will recognize that the embodiment(s) described above and illustrated in the attached drawings are intended for purposes of illustration only and that the subject invention may be implemented in various ways. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for fabricating a group of memory cells, comprising the steps of:

forming a first polysilicon (poly I) layer;

transforming at least a portion of the poly I layer into an electrically nonconductive material, the electrically nonconductive portion isolating at least two portions of the poly I layer from each other to create floating gates; and applying an interpoly dielectric layer over the electrically nonconductive portion and the at least two floating gates, wherein the interpoly dielectric layer is an oxide-nitride-oxide (ONO) layer.

2. The method of claim 1 wherein the step of transforming the at least a portion of the poly I layer into an electrically nonconductive material includes a step of transforming the at least a portion of the poly I layer into $SiO_{x(x \leq 1)}$.

3. The method of claim 1 wherein the step of transforming the at least a portion of the poly I layer into an electrically nonconductive material includes a step of transforming the at least a portion of the poly I layer into $Si_3N_{y(y \leq 4)}$.

4. The method of claim 1 wherein the step of transforming the at least a portion of the poly I layer into an electrically nonconductive material includes a step of transforming the at least a portion of the poly I layer into silicon oxy-nitride.

5. The method of claim 1 wherein the step of transforming the at least a portion of the poly I layer into an electrically nonconductive material includes a step of implanting ions at an energy within about the range of 1 to 10 KeV with a dose in about the range of $1 \times 10^{17}$ ions/cm$^2$ to $1 \times 10^{18}$ ions/cm$^2$.

6. The method of claim 1, further including the step of applying a control gate layer over the interpoly dielectric layer.

7. The method of claim 6, further including the step of masking the control gate layer and etching unmasked portions of the control gate.

8. The method of claim 7, further including the step of etching portions of the interpoly dielectric layer.

9. The method of claim 8, wherein the electrically nonconductive portion is etched.

10. The method of claim 8, further including the step of etching the poly I portions so as to define the memory cells.

11. A method for fabricating a first memory cell and a second memory cell electrically isolated from each other, comprising the steps of:

forming a first polysilicon (poly I) layer on an oxide coated substrate;

masking the poly I layer to pattern the first memory cell and the second memory cell and an unmasked portion therebetween; and transforming the unmasked portion of the poly I layer into an insulator via ion implantation and annealing such that the insulator electrically isolates a floating gate of the first memory cell from a floating gate of the second memory cell; and applying an interpoly dielectric layer over the insulator and the floating gates, wherein the interpoly dielectric layer is an oxide-nitride-oxide (ONO) layer.

12. The method of claim 11 further including a step of forming the interpoly dielectric layer and a second polysilicon (poly II) layer substantially free of abrupt changes in step height.

13. A method for fabricating a group of memory cells comprising the steps of:

forming at least first and second gate regions from a gate material;

transforming a portion of the gate material between the at least first and second gate regions into an insulator, wherein the insulator electrically isolates the first gate region from the second gate region; and applying an interpoly dielectric layer over the insulator and the first and second fate regions, wherein the interpoly dielectric layer is an oxide-nitride-oxide (ONO) layer.

14. The method of claim 13 further including the step of employing ion implantation in forming the insulator.

15. The method of claim 14 further including the step of implanting ions at an energy within about the range of 1 to 10 KeV.

16. The method of claim 14 further including the step of implanting ions at a dose within the range of $1 \times 10^{17}$ ions/cm$^2$ to $1 \times 10^{18}$ ions/cm$^2$.

17. The method of claim 13 further including the step of using polysilicon as the gate material.

18. The method of claim 13 further including the step of transforming the portion of the gate material between the at least first and second gate regions into at least one of: $SiO_{x(x \leq 1)}$ and $Si_3N_{y(y \leq 4)}$.

* * * * *